United States Patent
Sculley et al.

(10) Patent No.: US 6,172,628 B1
(45) Date of Patent: Jan. 9, 2001

(54) TONE MODULATION WITH SQUARE WAVE

(75) Inventors: Terry Sculley, Austin, TX (US); Edmund Chui, Sunnyvale, CA (US)

(73) Assignee: ESS Technology, Inc., Austin, TX (US)

( * ) Notice: Under 35 U.S.C. 154(b), the term of this patent shall be extended for 0 days.

(21) Appl. No.: 09/276,850

(22) Filed: Mar. 26, 1999

Related U.S. Application Data

(60) Provisional application No. 60/079,711, filed on Mar. 26, 1998.

(51) Int. Cl.$^7$ .................................................. H03M 1/10
(52) U.S. Cl. ........................................ 341/120; 341/143
(58) Field of Search .................................... 341/131, 143, 341/120

(56) References Cited

U.S. PATENT DOCUMENTS

| | | |
|---|---|---|
| 3,656,152 | 4/1972 | Gundersen ............... 340/347 AD |
| 4,187,466 | 2/1980 | Kasson et al. .................. 325/42 |
| 4,901,078 * | 2/1990 | Goyal ............................. 341/131 |
| 4,937,576 | 6/1990 | Yoshio et al. .................. 341/131 |
| 4,965,867 * | 10/1990 | Tsuchida et al. ............... 341/118 |
| 5,177,697 * | 1/1993 | Schanen et al. ................ 341/120 |
| 5,252,973 | 10/1993 | Masuda .......................... 341/131 |

* cited by examiner

*Primary Examiner*—Howard L. Williams
(74) *Attorney, Agent, or Firm*—Fish & Richardson P.C.

(57) ABSTRACT

Techniques for applying a periodic signal to an interpolated digital signal at the input of a delta-sigma modulator to reduce noise tones a DC noise level in the output of a delta-sigma DAC. The duty cycle of the periodic signal can be adjusted to substantially cancel the DC noise level. In one embodiment, the DC noise level is first determined by, e.g., a calibration process. Then, the duty cycle of the periodic signal is adjusted according to the determined DC noise level.

9 Claims, 1 Drawing Sheet

TONE MODULATION WITH SQUARE WAVE

CROSS REFERENCE TO RELATED APPLICATIONS

This application claims benefit of U.S. Provisional Application No. 60/079,711, filed on Mar. 26, 1998.

BACKGROUND

Delta-sigma digital to analog converters (DACs) are known in the art. A delta-sigma DAC includes an interpolation filter, sample and hold, and delta-sigma modulator. These parts form the digital section, which produces a one bit digital output or sometimes a multi bit output. A DAC also includes an analog part with a digital-to analog converter and an analog filter.

Noise reduction in DAC systems is important in improving DAC performance. When a zero DC input is applied to a delta-sigma modulator, the output spectrum often has a strong tone near $NxF_s/2$, where N is the oversampling ratio and $F_s$ is the sampling frequency of the DAC input data. If the DC level is increased or decreased, the tone will move to a lower frequency either directly or through aliasing. This strong tone is called the idle tone. The position of this undesirable idle tone will often modulate with noise on the DAC's reference voltage. This position of modulation may produce spurious tones within the signal passband due to noise on the reference at frequencies near $NxF_s/2$. Noise at $NxF_s/2$ frequency is easily coupled onto the reference by clocks or digital switching activity. So, a small DC input will cause the idle tone near $NxF_s/2$ to modulate with noise at $NxF_s/2$ to produce a spurious tone near DC. This may detract from the high quality of audio that is desired.

SUMMARY

The present system defines a way of changing certain characteristics of this system. More specifically, the present system defines a way of moving certain parts of the noise outside of the signal pass band.

BRIEF DESCRIPTION OF THE DRAWINGS

These and other aspects will be described in detail with reference to the accompanying drawings, wherein.

DESCRIPTION OF THE PREFERRED EMBODIMENTS

Figure 1:
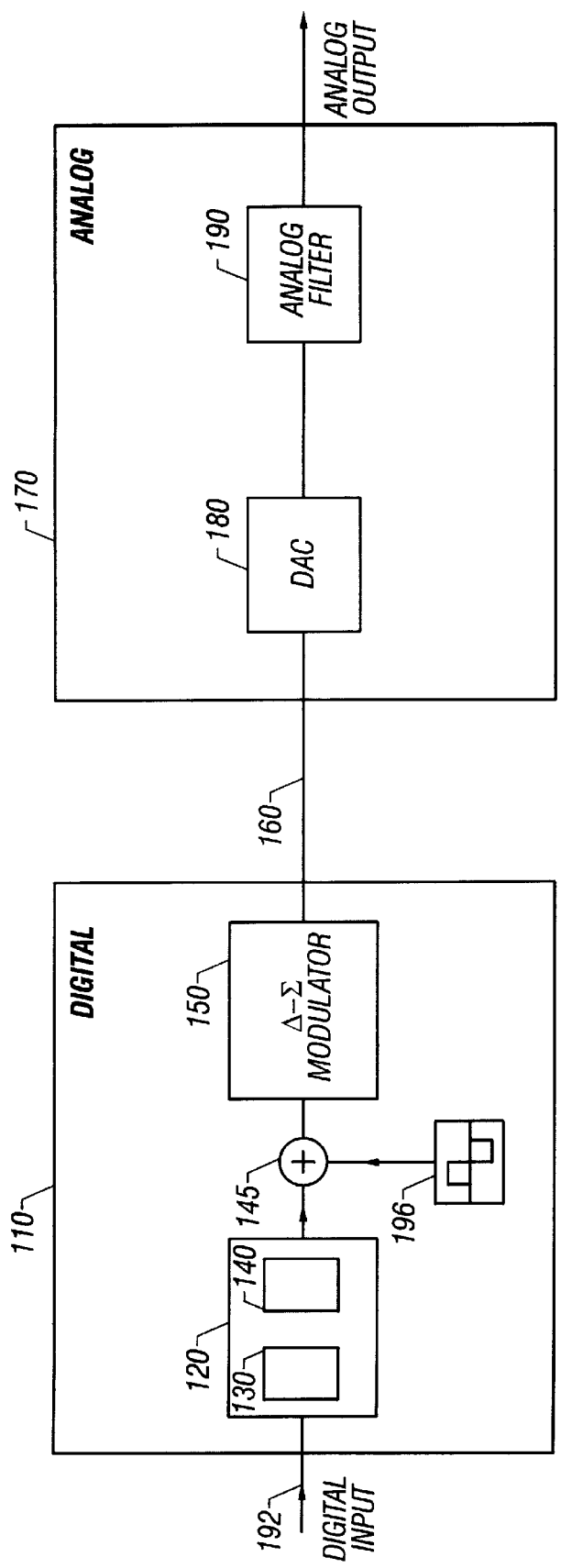
FIG. 1 shows a basic block diagram of the overall system.
Figure 2:
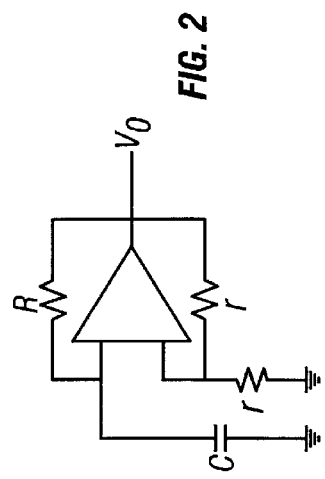
FIG. 2 shows a schematic diagram of a preferred square wave generator.

Oversampling conversion techniques are utilized in a delta-sigma digital-to-analog converter (DAC) system such as shown in FIG. 1. The DAC system has a digital section 110 and an analog section 170.

The digital section 110 includes an interpolation circuit 120, with an interpolation filter 130 and a sample and hold circuit 140. A summing junction 145 is positioned to sum data from the interpolation circuit 120. A delta-sigma modulator 150, which spectrally shapes quantization noise, is used as a one-bit digital quantizer. The one-bit digital output 160 is input into the analog section 170. The analog section 170 has a one-bit digital-to-analog converter (DAC) 180 and an analog low pass filter 190.

The general operation of the digital section is known in the art. A digital input 192 enters the interpolation filter 130. This signal is sampled. The interpolation filter 130 then filters all signals and quantization noise at $F_s/2$ and above, $F_s$ being the input sampling frequency.

The output of interpolation filter 130 is processed through the sample and hold circuit 140 to provide the oversampled output. This oversampled output has a sampling frequency of $NxF_s$, where N is the oversampling ratio. Therefore, as described above, the idle tone often produces noise in the output signal.

The present inventors recognized, however, that the signal pass band is limited. The pass band typically extends from near DC to approximately $F_s/2$. According to the present system, the spurious tone is frequency modulated to move it outside of the signal pass band. This is done by adding high frequency, low amplitude periodic square wave to the oversampled digital signal going into the digital delta-sigma modulator 150. The amplitude of the square wave must be large enough to move the tone out of the signal passband, and the frequency of the square wave must be out of the signal passband, typically at a frequency much higher than $F_s/2$ but below $NxF_s/2$. This square wave addition 196 can be incorporated within the interpolation filter 130. The square wave addition 196 can also be incorporated between the interpolation filter 130 and the delta-sigma modulator 150, as shown in FIG. 1.

The output is then summed by the summing junction 145. The output of the summing junction 145 is input into the delta-sigma modulator 150 which converts this oversampled signal into the one-bit digital output 160. The one-bit digital output 160 contains quantization noise that is predominantly shifted into the frequency range above $F_s/2$. The one-bit digital output 160 is fed into the DAC 180. The resulting analog signal from the DAC 180 is then input to the analog low pass filter 190. The analog low pass filter 190 filters out some of the quantization noise above $F_s/2$.

The square wave is preferably produced digitally, typically by generating a one-bit clock of the desired square wave frequency. The one-bit clock is used to control whether a constant digital value is either added or subtracted from the interpolation filter output. The constant digital value then has the amplitude of the square wave signal. In one preferred embodiment, a square wave having a fifty percent duty cycle is used so that no additional DC component is introduced into the delta-sigma modulator output spectrum by this square wave addition. In another embodiment, the square wave or other periodic signal with duty cycle other than fifty percent can also be used.

When a zero or small DC input is applied to the DAC system, the high frequency square wave will cause the idle tone to be pulled away from $NxF_s/2$. However, the output spectrum will have tones at the frequency of the square wave and harmonics at multiples of this frequency. These high frequency out-of-band tones can be attenuated as much as desired by the analog filter 190.

In one preferred embodiment, for a 16 bit, 48 kHz digital input which is being oversampled at 12.288 MHZ, a 96 kHz square wave with amplitude of 1/64th full scale is added to the interpolation filter output. This sum is input to the digital delta-sigma modulator. This square wave addition is sufficient to move the spurious tone outside the signal passband of approximately DC to 20 kHz.

This technique is effective in addressing cases of DAC input of zero and some very small non-zero DC levels. As the input DC level gets larger, the larger input can move the idle tone closer to $N \times F_s/2$. However, the inventors are concerned with the case of having low amplitude signals with a zero or very low DC level.

The tone modulation with square wave technique can be applied in many variations for alternative embodiments. One such alternative is to add an analog square wave to the input of an analog delta-sigma modulator to avoid similar tone modulation problems. In this case, it may also be preferred to place the analog square wave at a particular frequency such that the digital decimation filter that typically follows an analog delta-sigma modulator will have a notch, or ideally infinite attenuation, at this frequency and possibly at all of its harmonic frequencies.

Another alternative uses a bandpass delta-sigma modulator or highpass delta-sigma modulator in place of the more typically-used lowpass delta-sigma modulator included here. In these cases, the square wave may not need to be high frequency but may instead be at a lower frequency than the signal passband to accomplish the similar results.

In another embodiment, an analog bandpass or highpass delta-sigma modulator could be used, with an analog square wave applied at the modulator input.

Another alternative uses a periodic signal other than a square wave. The signal addition reduces the level of spurious components present in the signal passband.

Yet another alternative uses a random signal with controlled amplitude and spectral shaping such that the random signal does not add any significant energy within the signal passband, but still reduces the spurious tones produced by the tone modulation effect.

Another embodiment uses these similar techniques to reduce spurious tones caused inherently by the modulator, not by noise on the reference. When certain signals, such as low amplitude DC levels, are applied to a delta-sigma modulator, the resulting output spectrum may have strong tones within the signal passband due only to the modulator itself. By adding a square wave or random signal as described above, these spurious tones are widely distributed and thus appear as a slightly elevated noise floor rather than as distinct tones.

The addition of a square wave at the input of a delta-sigma modulator can also be used to adjust the DC level of the output, such as might be used to correct for an unintended DC offset in the system path, whether in an ADC system or a DAC system. The square wave still has a frequency higher than the signal passband, but now the duty cycle of the square wave can be adjusted away from fifty percent in order to add or subtract a DC level from the system.

For example, if a DAC is operating with an oversampling ratio N of 128, and it is known that the passband is from near DC to approximately $F_s/2$, then a square wave of frequency $F_s$ can be added at the input without corrupting the signal passband. This square wave has a period of 128 samples of the oversampling clock rate. The square wave has a positive value for 64 clocks and then a negative value for 64 clocks in a fifty percent duty cycle mode. Adjusting the duty cycle while still keeping the period equal to 128 clocks is possible. This is done by changing the time the square wave is high from 64 clocks to 64+k clocks per period, with k being an integer between −64 and +64. If k=0, then the square wave has fifty percent duty cycle and adds zero DC to the signal. If k>0 then the square wave adds positive DC to the signal. If k<0, then the square wave adds negative DC to the signal. In this way, the DC offset of the system can be adjusted in small increments.

The actual amount that the DC offset is adjusted depends on both the duty cycle and on the amplitude of the square wave used. A larger amplitude square wave will change the offset more for every unit change in the value of k than will a smaller amplitude square wave with the same period. Thus, the addition of a square wave can be used for both avoiding spurious tones in the signal passband and also to adjust the DC output level of the system at the same time. This use of duty cycle to adjust the DC output level can be done in a hard-coded manner or can be adjustable, with the exact level to be determined during a calibration step that occurs each time the circuit is powered on or whenever a calibration is initiated by some signal.

Note that this technique can apply to the many alternative embodiments mentioned earlier for the earlier case. One of particular interest is when used in conjunction with a bandpass delta-sigma modulator. Some implementations of bandpass delta-sigma modulators, particularly those with the passband centered at one-fourth of the oversampling frequency, suffer from a spurious signal that appears at the very center of the passband, exactly at one-fourth of the oversampling frequency. This square wave additive technique can be combined with a simple digital modulation technique in order to remove this single spurious tone.

The text above describes using a square wave with variable duty cycle to move then cancel DC offset in a lowpass delta-sigma modulator. By taking this square wave signal and multiplying the square wave signal by the periodic sequence {+1, +1, −1, −1}, with period=4, then adding the square wave signal to the interpolation filter output before applying the sum to the delta-sigma modulator, the level of the resulting spurious signal at one-fourth the oversampling frequency can be decreased until the spurious signal is effectively removed from the system. Note also that the above sequence, and that many other sequences with differing periods and element values can also be used. These two sequences are mentioned because they have very simple values, such as +1, 0, or −1, which makes multiplication by these sequences trivial, and they have very short period. Other sequences with more values or differing period may be more attractive for other applications.

What is claimed is:

1. A method, comprising:

interpolating an digital input signal at an input sampling frequency to produce an interpolated digital signal at an interpolated sampling frequency related to and higher than said input sampling frequency;

adding a periodic signal to said interpolated digital signal to produce a summed signal so as to shift a noise tone outside a transmission spectral range associated with said digital input signal;

using a delta-sigma modulator to convert said summed signal into a one-bit signal;

converting said one-bit signal into an analog signal; and adjusting a duty cycle of said periodic signal, without changing its frequency, to control a DC level of said analog signal.

2. The method as in claim 1, wherein said duty cycle of said periodic signal is set a value different from 50% to substantially cancel an unintended DC offset in said analog signal.

3. The method as in claim 1, wherein said delta-sigma modulator is a lowpass modulator, and wherein said periodic signal has a frequency greater than a maximum frequency of said transmission spectral range.

4. The method as in claim 3, wherein said frequency of said periodic signal is greater than one half of said input sampling frequency and is less than one half of said interpolated sampling frequency.

5. The method as in claim 1, wherein said delta-sigma modulator is a bandpass modulator or a highpass modulator, wherein said periodic signal has a frequency less than a minimum frequency of said transmission spectral range of said delta-sigma modulator.

6. The method as in claim 1, wherein said period signal includes a square wave signal.

7. The method as in claim 6, wherein said duty cycle is adjusted by multiplying a periodic binary sequence to said square wave.

8. The method as in claim 1, wherein said delta-sigma modulator is a bandpass modulator whose bandpass window centers at one fourth of said interpolated sampling frequency.

9. The method as in claim 1, wherein said DC level includes a contribution from noise, and further comprising:

determining said DC contribution from noise through a calibration process, and adjusting said duty cycle to offset said DC contribution from noise.

\* \* \* \* \*